US011195892B2

(12) United States Patent
Maeda (10) Patent No.: US 11,195,892 B2
(45) Date of Patent: Dec. 7, 2021

(54) ELECTROLUMINESCENCE DISPLAY DEVICE AND MANUFACTURING METHOD THEREOF

(71) Applicant: Japan Display Inc., Minato-ku (JP)

(72) Inventor: Norihisa Maeda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/731,173

(22) Filed: Dec. 31, 2019

(65) Prior Publication Data

US 2020/0227492 A1 Jul. 16, 2020

(30) Foreign Application Priority Data

Jan. 11, 2019 (JP) .............................. JP2019-003253

(51) Int. Cl.
*H01L 27/32* (2006.01)
*H01L 51/50* (2006.01)
*H01L 51/00* (2006.01)
*H01L 51/56* (2006.01)

(52) U.S. Cl.
CPC ...... *H01L 27/3246* (2013.01); *H01L 51/0011* (2013.01); *H01L 51/5036* (2013.01); *H01L 51/5096* (2013.01); *H01L 51/56* (2013.01); *H01L 2227/323* (2013.01)

(58) Field of Classification Search
CPC ............. H01L 27/3246; H01L 51/0011; H01L 51/5036; H01L 51/5096; H01L 51/56; H01L 2227/323
USPC ........................................................ 257/40
See application file for complete search history.

(56) References Cited

U.S. PATENT DOCUMENTS

| | | | | |
|---|---|---|---|---|
| 2004/0217697 A1* | 11/2004 | Lee | ...................... | H01L 51/5218 313/504 |
| 2006/0289882 A1* | 12/2006 | Nishimura | ............. | H05B 33/14 257/94 |
| 2008/0102310 A1* | 5/2008 | Thompson | .......... | H01L 51/5036 428/690 |
| 2008/0315753 A1* | 12/2008 | Liao | .................... | H01L 51/5096 313/504 |
| 2010/0044690 A1* | 2/2010 | Okutani | ............. | H01L 27/3211 257/40 |
| 2013/0153881 A1 | 6/2013 | Tokoo et al. | | |

(Continued)

FOREIGN PATENT DOCUMENTS

WO WO 2012/039213 A1 3/2012

*Primary Examiner* — Dzung Tran
(74) *Attorney, Agent, or Firm* — Oblon, McClelland, Maier & Neustadt, L.L.P.

(57) ABSTRACT

An electroluminescence display device includes an array of pixels in which pixels emitting light of a specific color are regularly aligned and which includes at least a plurality of pixels emitting light of different colors, and in which, in the pixel, a common electrode, a first blocking layer, a light emitting layer, a second blocking layer, and a pixel electrode are laminated in this order when viewed from a viewing direction, at least the light emitting layer, the second blocking layer, and the pixel electrode are provided independently for each pixel, adjacent pixels are separated by a bank, and, at least in a part of the array of pixels, on the bank, the second blocking layer belonging to another pixel having a light-emission color different from that of one pixel is partially overlapped on the light emitting layer belonging to the one pixel.

4 Claims, 8 Drawing Sheets

(56) References Cited

U.S. PATENT DOCUMENTS

2018/0331315 A1\* 11/2018 Maeda ................ H01L 51/5203
2020/0033244 A1 1/2020 Boutami et al.

\* cited by examiner

FIG.1

RELATED ART

FIG.2

RELATED ART

ELECTROLUMINESCENCE DISPLAY DEVICE AND MANUFACTURING METHOD THEREOF

CROSS-REFERENCE TO RELATED APPLICATION

The present application claims priority from Japanese application JP 2019-003253 filed on Jan. 11, 2019, the content of which is hereby incorporated by reference into this application.

BACKGROUND OF THE INVENTION

1. Field of the Invention

The present invention relates to an electroluminescence display device and a manufacturing method thereof.

2. Description of the Related Art

In WO 2012/039213 A1, an organic light emitting device in which a plurality of charge generation layers and organic layers are laminated so as to overlap each other is described. In particular, in FIG. 3, a cross-sectional view illustrating an embodiment in which a first organic layer, a first charge generation layer, a second organic layer, a second charge generation layer, and a third organic layer are laminated in this order is illustrated.

Figure 1:
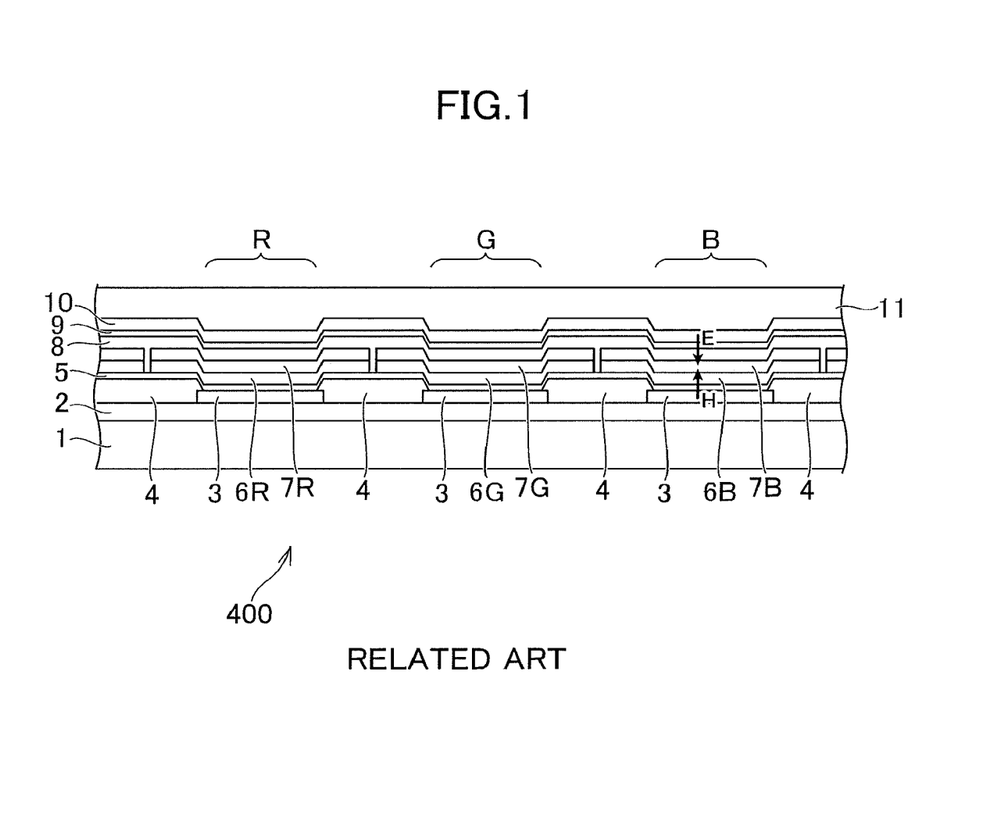
FIG. 1 is a schematic cross-sectional view illustrating a typical structure of a top emission type electroluminescence display device.

FIG. 1 is a schematic cross-sectional view illustrating a typical structure of a top emission type electroluminescence display device 400. The electroluminescence display device 400 has a structure in which a substrate 1, a circuit layer 2 formed on the substrate 1, a pixel electrode 3 formed for each pixel, a bank 4 separating pixels, a hole injection layer 5 formed across the pixel electrode 3 and the bank 4, electron blocking layers 6R, 6G, and 6B and light emitting layers 7R, 7G, and 7B formed independently for each pixel, a hole blocking layer 8, an electron injection layer 9, a common electrode 10, and a sealing layer 11 are laminated in this order.

In the electroluminescence display device 400 illustrated in FIG. 1, each pixel has a light-emission color in any of three colors of RGB, and each region partitioned by the bank 4 is one pixel. In FIG. 1, each pixel is illustrated with the reference letters R, G, and B symbols depending on its color. A region of the pixel partitioned by the bank 4 may be referred to as an opening region, while a region other than the pixel in which the bank 4 is formed may be referred to as a matrix region.

The electron blocking layer 6 and the light emitting layer 7 formed independently for each pixel are attached with a letter of R, G, or B at the end of the reference numerals to indicate which light-emission color pixel the electron blocking layer 6 and the light emitting layer 7 belong to. If it is not intended to specify which pixel the electron blocking layer 6 and the light emitting layer 7 belong to, it is simply indicated as an electron blocking layer 6 or a light emitting layer 7 without attaching any of the letters R, G, and B.

In the example illustrated in FIG. 1, although the hole injection layer 5 and the electron injection layer 9 are provided in common without being independent for each pixel, both or either of the hole injection layer 5 and the electron injection layer 9 may be provided independently for each pixel.

In the electroluminescence display device 400 of FIG. 1, for example, if description is made by taking a pixel B as an example for a case of causing any pixel to emit light, when a positive voltage is applied to the pixel electrode 3 belonging to the pixel B, holes that reach the light emitting layer 7B through the hole injection layer 5 and the electron blocking layer 6B and electrons that reach the light emitting layer 7B from the common electrode 10 through the electron injection layer 9 and the hole blocking layer 8 are combined to emit blue light in accordance with a material of the light emitting layer 7B. In FIG. 1, a movement path of the holes is indicated by an arrow H, and a movement path of the electrons is indicated by an arrow E.

Each layer constituting the electroluminescence display device 400 illustrated in FIG. 1 is generally formed by a film-forming process such as photolithography or vapor deposition using a fine mask. In this case, a position where each layer is formed may be shifted by several μm in the horizontal direction due to the influence of mechanical positioning accuracy, a dimensional error of material, and the like. This position shift cannot be ignored in view of the fact that a pixel size is generally about several tens of μm to several hundreds of μm.

Figure 2:
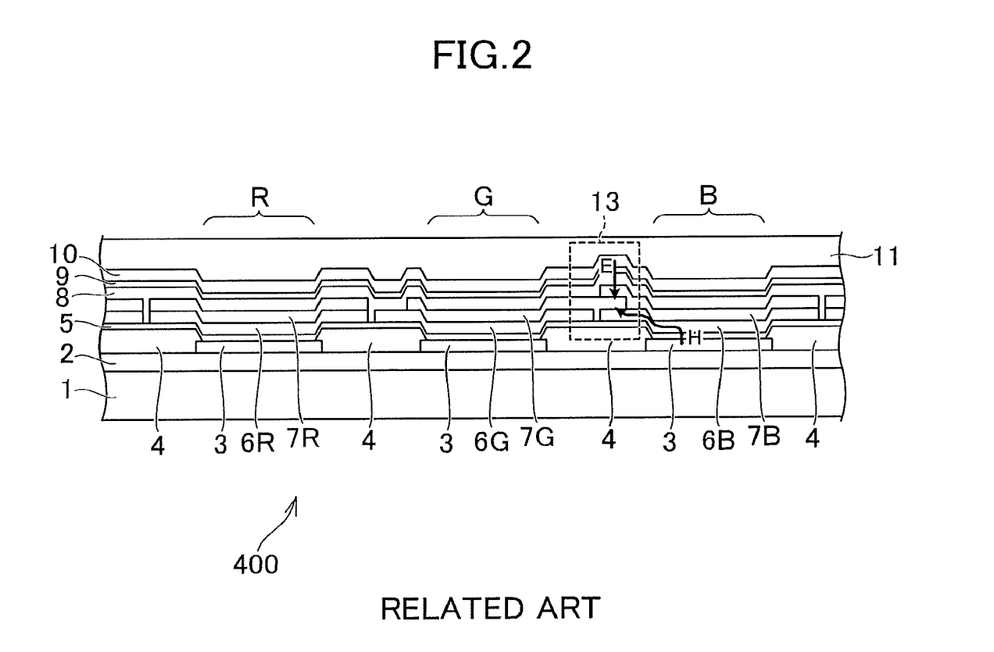
FIG. 2 is a schematic cross-sectional view illustrating the structure of the electroluminescence display device when a light emitting layer of a pixel G is formed by being shifted to the right side in the drawing.

Due to such a shift, for example, as illustrated in FIG. 2, a case where the light emitting layer 7G of the pixel G is formed by being shifted to the right side in the drawing and overlaps the electron blocking layer 6B of the adjacent pixel B in a region 13 on the bank 4, is considered. In FIG. 2, in the region 13, the light emitting layer 7B is overlapped on the light emitting layer 7G. In a case where the pixel G or the pixel B is caused to emit light at this time, here, a case where the pixel B is caused to emit light is considered.

When a positive voltage is applied to the pixel electrode 3 belonging to the pixel B, most of the generated holes and electrons are combined within a range of the pixel B to cause the pixel B to emit blue light. However, some holes move in the electron blocking layer 6B to the outside of the pixel B and enter the region 13 as illustrated by the arrow H. Such holes combine with electrons introduced from the common electrode 10 in the light emitting layer 7G as indicated by the arrow E, and unintentional green light emission occurs.

As such, light emission of an unintentional color may occur on the bank 4 due to the shift in the horizontal direction of each layer constituting the electroluminescence display device 400. When such light emission occurs, a reduction in color purity occurs due to the color mixture, which lowers the quality of a display image by the electroluminescence display device 400.

If there is no shift in the horizontal direction in each layer constituting the electroluminescence display device 400, the color mixture described above usually does not occur, but similarly as in the case described with reference to FIG. 2, when some of the generated holes move in the electron blocking layer 6 to the outside of the pixel and combine with the electrons on the bank 4, light emission outside the pixel may occur although the color is the same. Such light emission does not significantly affect the quality of the displayed image, but since light emission on the bank 4 is not taken into consideration, such light emission is wasteful and becomes one of the causes of a decrease in light emission efficiency.

SUMMARY OF THE INVENTION

The present invention has been made to improve the problems described above, and an object thereof is to reduce color mixture due to unintentional light emission of the adjacent pixel color, and occurrence of light emission of its own color on a bank in an electroluminescence display device.

The invention disclosed in the present application in order to solve the problems described above has various aspects, and an outline of typical ones of these aspects is as follows.

(1) An electroluminescence display device including an array of pixels in which pixels emitting light of a specific color are regularly arrayed and which is composed of at least a plurality of pixels emitting light of mutually different colors, and in which, in the pixel, a common electrode, a first blocking layer, a light emitting layer, a second blocking layer, and a pixel electrode are laminated in this order when viewed from a viewing direction, at least the light emitting layer, the second blocking layer, and the pixel electrode are provided independently for each pixel, adjacent pixels are separated by a bank, and, at least in a part of the array of pixels, on the bank, the second blocking layer belonging to another pixel having a light-emission color different from that of one pixel is partially overlapped on the light emitting layer belonging to the one pixel.

(2) In the electroluminescence display device of (1), at least in a part of the array of pixels, on the bank, the second blocking layer belonging to the other pixel having a light-emission color different from that of one pixel is partially overlapped on the light emitting layer belonging to the one pixel, and the light emitting layer belonging to the other pixel is partially overlapped further on the second blocking layer.

(3) In the electroluminescence display device of (1) or (2), in a pixel belonging to the array of pixels having at least one light-emission color, an area of the second blocking layer is larger than the area of the light emitting layer.

(4) In the electroluminescence display device of (3), in a pixel belonging to the array of pixels having another light-emission color different from the one light-emission color, the area of the second blocking layer and the area of the emission layer are equal.

(5) In the electroluminescence display device of (3) or (4), at least in a part of the array of pixels, on the bank, the second blocking layer belonging to another pixel having a light-emission color different from that of one pixel is partially overlapped on the second blocking layer belonging to the one pixel.

(6) In the electroluminescence display device of (3) or (4), in a pixel belonging to the array of pixels having the one light-emission color, a geometric center of the second blocking layer is offset from the geometric center of the light emitting layer.

(7) A manufacturing method of an electroluminescence display device including a step of forming a pixel electrode, and a bank separating adjacent pixels on a substrate, a step of forming a second blocking layer using a first mask for one light-emission color and then forming a light emitting layer using a second mask different from the first mask, thereafter, a step of forming a second blocking layer using a third mask for another light-emission color at least different from the one light-emission color and then forming a light emitting layer using a fourth mask different from the third mask, and a step of forming a first blocking layer and a common electrode.

(8) In the manufacturing method of the electroluminescence display device of (7), an area of the second blocking layer for at least the other light-emission color is larger than the area of the light emission layer for the other light-emission color.

DETAILED DESCRIPTION OF THE INVENTION

An electroluminescence display device 100 according to the first embodiment of the present invention is characterized by its manufacturing process and a structure produced by the manufacturing process. For that reason, first, a manufacturing method of the electroluminescence display device 100 according to a first embodiment will be described below. The configuration itself of the electroluminescence display device 100 is the same as that of the electroluminescence display device 400 previously described with reference to FIG. 1, and thus FIG. 1 is used.

First, a manufacturing method of the electroluminescence display device 400 previously described will be described.

A circuit layer 2 including a thin film transistor, a wiring thereof, and the like is created on a substrate 1. Since various structures of the circuit layer 2 and creating methods thereof are known, a detailed description thereof will be omitted in this specification.

Subsequently, a pixel electrode 3 and a bank 4 are formed on the circuit layer 2. The bank 4 is formed to cover end portions of the pixel electrode 3. For this formation, a known technique such as photolithography may be appropriately used.

Furthermore, a hole injection layer 5 is formed to straddle the pixel electrode 3 and the bank 4. For a material and a forming method of the hole injection layer 5, a known material and forming method may also be used. The hole injection layer 5 may be formed in an independent shape for each pixel.

An electron blocking layer 6 and a light emitting layer 7 are formed to cover an opening region of each pixel. The electron blocking layer 6 may be collectively created as common to each pixel, but in order to obtain a film-forming condition and a material suitable for the material of the light emitting layer 7, that is, for each light-emission color, the electron blocking layer 6 is created by a different process for each light-emission color of the pixel.

In this case, as illustrated in FIG. 1, assuming that the electro luminescence display device 400 emits light in three colors of red, green, and blue, the order of creation of the electron blocking layer 6 and the light emitting layer 7 is as follows:
1) electron blocking layer 6R;
2) electron blocking layer 6G;
3) electron blocking layer 6B;
4) light emitting layer 7R;
5) light emitting layer 7G; and
6) light emitting layer 7B.

Creation of the electron blocking layer 6 and the light emitting layer 7 is performed for each type of layer, and in many cases, the electron blocking layer 6 and the light emitting layer 7 are deteriorated due to entry of or contact with impurities such as moisture in the environment, and thus, vacuum deposition using a mask is selected. Since a dedicated mask is used for each layer, for example, a mask used for forming the electron blocking layer 6R and a mask used for forming the electron blocking layer 6G are different, and the mask and the substrate 1 need to be aligned each time.

Thereafter, the electroluminescence display device 400 is manufactured by creating a hole blocking layer 8, an electron injection layer 9, and a common electrode 10 in this order, and then forming a sealing layer 11.

The polarity may be reversed above and below the light emitting layer 7. In FIG. 1, the common electrode 10, the electron injection layer 9, the hole blocking layer 8, the light emitting layer 7, the electron blocking layer 6, the hole injection layer 5, and the pixel electrode 3 are aligned in this order from the top in the drawing, which is the viewing direction of the electroluminescence display device 400. However, when the polarity is reversed, the positions of the electron injection layer 9 and the hole injection layer 5, and the hole blocking layer 8 and the electron blocking layer 6 are switched, respectively. Accordingly, when viewed from the viewing direction of the electroluminescence display device 400, if a layer in front of the light emitting layer 7 is referred to as a first blocking layer, and a layer at the back of the light emitting layer 7 is referred to as a seconding blocking layer, in the example illustrated in FIG. 1, the hole blocking layer 8 corresponds to the first blocking layer, and the electron blocking layer 6 corresponds to the second blocking layer.

In contrast, in the electroluminescence display device 100 according to the first embodiment, creation of the electron blocking layer 6 and the light emitting layer 7 are performed in the following order:
1) electron blocking layer 6R;
2) light emitting layer 7R;
3) electron blocking layer 6G;
4) light emitting layer 7G;
5) electron blocking layer 6B; and
6) light emitting layer 7B.

That is, for a single color, a process of forming the electron blocking layer 6 and subsequently forming the light emitting layer 7 for the same color is repeated for the number of colors.

When describing the process more generally, this process can be described as a process of forming a second blocking layer using a first mask for one light-emission color and then forming the light emitting layer 7 using a second mask, and thereafter, further forming the second blocking layer using a third mask for another light-emission color and then forming the light emitting layer 7 using a fourth mask.

Here, assuming that one light-emission color is red, in this embodiment, the electron blocking layer 6R is formed by the first mask, the light emitting layer 7R is further formed by the second mask, and then the electron blocking layer 6G is formed by the third mask, and the light emitting layer 7G is further formed by the fourth mask.

Assuming that one light-emission color is green, in this embodiment, the electron blocking layer 6G is formed by the first mask, the light emitting layer 7G is further formed by the second mask, and then the electron blocking layer 6B is formed by the third mask, and the light emitting layer 7B is further formed by the fourth mask.

That is, this process does not depend on the number of colors (however, there are a plurality of colors) of the electroluminescence display device 100, and does not depend on the order of forming each color.

In the electroluminescence display device 100 created in this way, when each layer is accurately formed without causing a positional shift in the manufacturing process, the completed electroluminescence display device 100 is the same as that illustrated in FIG. 1, and there is no difference.

However, actually, as described above, in the process of manufacturing each layer, the position in the horizontal direction of each layer may be shifted by about several Since a layer in which this shift occurs, a direction of the shift, and an amount of the shift are determined stochastically, the result cannot be definitely predicted in a general manner. Therefore, here, as an example, a case where the light emitting layer 7G of the pixel G is formed by being shifted to the right side in the drawing is considered, similarly as in the case illustrated in FIG. 2.

Figure 3:
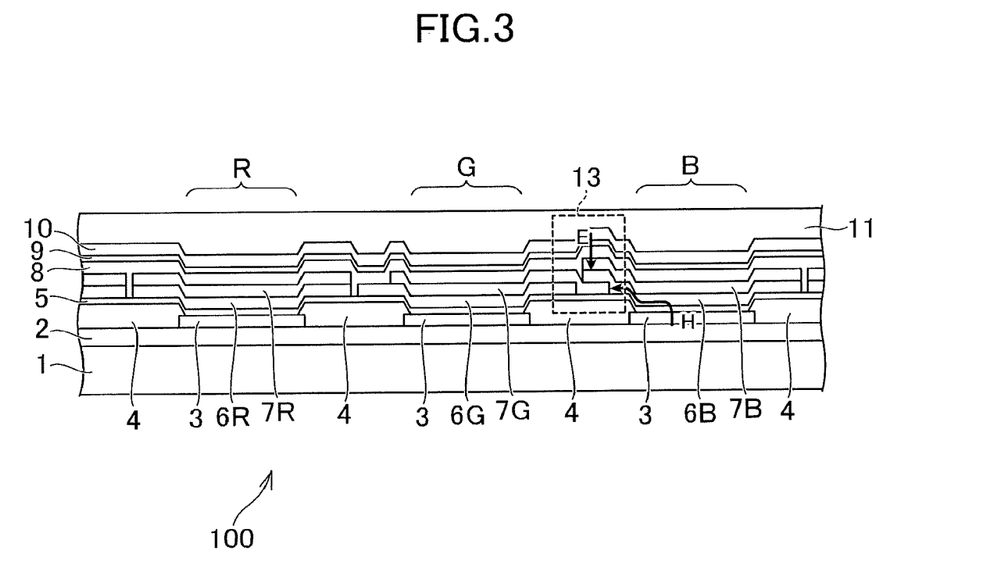
FIG. 3 is a schematic cross-sectional view illustrating a structure of an electroluminescence display device according to a first embodiment of the present invention when the light emitting layer of the pixel G is formed by being shifted to the right side in the drawing.

FIG. 3 is a schematic cross-sectional view illustrating the structure of the electroluminescence display device 100 when the light emitting layer 7G of the pixel G is formed by being shifted to the right side in the drawing. In a region 13, the light emitting layer 7G overlaps the light emitting layer 7B of the pixel B on the bank 4 similarly as in the example of FIG. 2.

However, in the electroluminescence display device 100, since the electron blocking layer 6B of the pixel B is formed after the light emitting layer 7G is formed, and then the light emitting layer 7B is formed, as illustrated in FIG. 3, the electron blocking layer 6B is formed on the light emitting layer 7G extending to the pixel B side on the bank 4, and the light emitting layer 7B overlaps the light emitting layer 7G across the electron blocking layer 6B.

Even in this case, it is considered that some holes can move in the electron blocking layer 6B to the outside of the pixel B as indicated by an arrow H, enter the region 13, and reach the light emitting layer 7G. However, the electrons introduced from the common electrode 10 are blocked by the electron blocking layer 6B as indicated by an arrow E and cannot reach the light emitting layer 7G. Therefore, holes and electrons are not combined in the light emitting layer 7G, and unintentional light emission on the bank 4 is prevented.

The case described with reference to FIG. 3 shows an example of various shifts occurring in each layer, and does not cover all the various cases. Therefore, as described with reference to FIG. 2, a case where the light emitting layer 7G and the light emitting layer 7B directly contact and overlap each other on the bank 4 (for example, a case where the light emitting layer 7G of the pixel G is formed by being shifted to the right side in the drawing and the electron blocking layer 6B of the pixel B is simultaneously formed by being shifted to the right side in the figure) may occur. In such a case, unintentional light emission on the bank 4 cannot be completely prevented.

However, as illustrated in FIG. 3, in the case where the electron blocking layer 6B partially overlaps the light emitting layer 7G on the bank 4, unintentional light emission on the bank 4 can be prevented. When expressing this case in a general manner, when the electroluminescence display device 100 is formed in such a way that, at least in a part of the array of pixels in which pixels emitting light of a specific color are regularly aligned, the second blocking layer 6 belonging to another pixel having a different light emission color from one pixel is partially overlapped on the light emitting layer 7 belonging to the one pixel, on the bank 4, unintentional light emission on the bank 4 can be prevented and such a structure occurs stochastically.

That is, even when the position in the horizontal direction of each layer constituting the electroluminescence display device 100 is formed by being shifted, unintentional light emission on the bank 4 is prevented with a certain probability, and as a whole, unintentional light emission on the bank 4 is reduced, which contributes to a reduction in in-plane variation of the display device and an improvement in product yield.

In the case illustrated in FIG. 3, the second blocking layer 6 that belongs to another pixel having a different light emission color from one pixel is partially overlapped on the light emitting layer 7 that belongs to the one pixel, on the bank 4, and the light emitting layer 7 belonging to the other pixel is partially overlapped on the second blocking layer 6 again, and even in such a case, unintentional light emission on the bank 4 is prevented.

In the first embodiment described above, although planar shapes of the second blocking layer 6 and the light emitting layer 7 are substantially the same for each color, and accordingly, the areas thereof are substantially equal to each other, this may be different.

Figure 4:
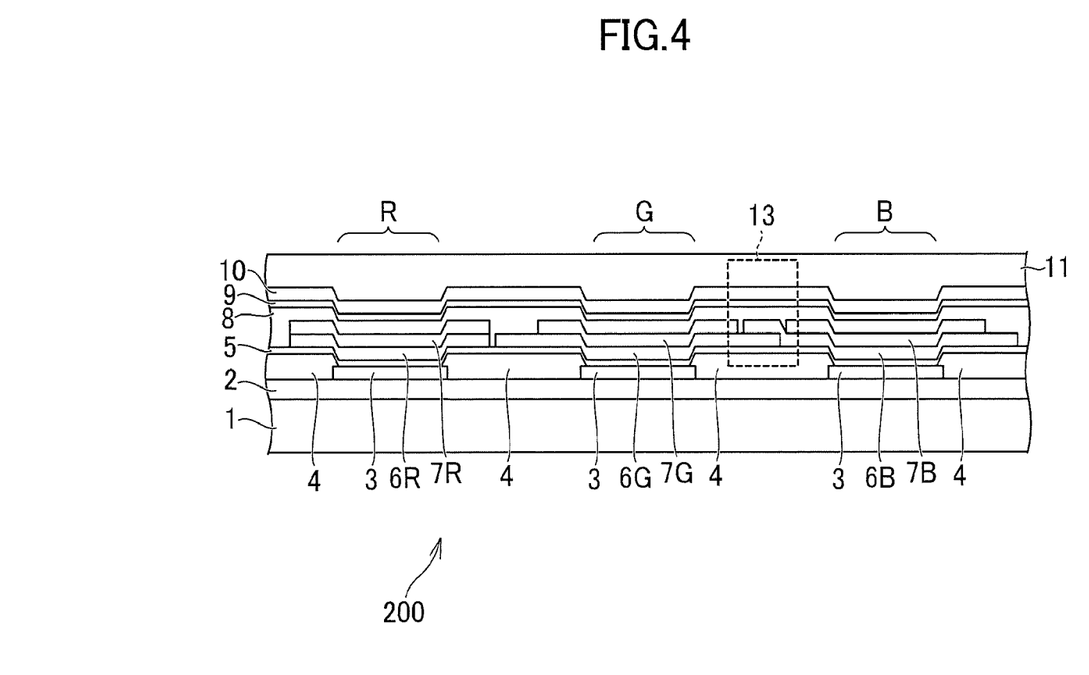
FIG. 4 is a schematic cross-sectional view illustrating a structure of an electroluminescence display device according to a second embodiment of the present invention.

FIG. 4 is a schematic cross-sectional view illustrating the structure of an electroluminescence display device 200 according to the second embodiment of the present invention. This embodiment differs from the electroluminescence display device 100 according to the first embodiment in that the areas of the electron blocking layer 6G of the pixel G and the electron blocking layer 6B of the pixel B in plan view are larger than those of the light emitting layer 7G of the pixel G and the light emitting layer 7B of the pixel B, respectively, and the electron blocking layers 6G and 6B are formed to protrude around the light emitting layers 7G and 7B. The other points are the same.

As illustrated in FIG. 4, in the electroluminescence display device 200, a pixel R is not structurally different from that of the electroluminescence display device 100 described above, and the electron blocking layer 6R and the light emitting layer 7R have the same planar shape and equal areas. Accordingly, when the electron blocking layer 6R and the light emitting layer 7R are formed accurately without shifting from a position in the design, these layers overlap each other without protruding from each other, as illustrated in FIG. 4.

On the other hand, in the pixel G, the electron blocking layer 6G has a larger planar shape than the light emitting layer 7G, and the area of the electron blocking layer 6G is larger than the area of the light emitting layer 7G. In this embodiment, as for the position in design, the center position of the electron blocking layer 6G and the center position of the light emitting layer 7G are designed to be equal and thus, when these layers are formed accurately without shifting from the position in design, the outer peripheral portion of the electron blocking layer 6G is disposed to protrude evenly on the left and right from the peripheral edge of the light emitting layer 7G, as illustrated in FIG. 4. In consideration of the accuracy of a film-forming apparatus and a member, the amount of protrusion is preferably a length that allows the light emitting layer 7G not to protrude outside the electron blocking layer 6G in plan view, or a length that allows the possibility of the protrusion to be practically ignored.

The pixel B is the same as the pixel G, and the electron blocking layer 6B has a larger planar shape than the light emitting layer 7B, and the area of the electron blocking layer 6B is larger than the area of the light emitting layer 7B. The center position of the electron blocking layer 6B and the center position of the light emitting layer 7B are designed to be equal, and when these layers are formed accurately without shifting from the position in design, the outer peripheral portion of the electron blocking layer 6B is disposed to protrude evenly on the left and right from the peripheral edge of the light emitting layer 7B. As a result, as seen in the region 13 in the drawing, a part of the electron blocking layer 6B is overlapped on the electron blocking layer 6B, on the bank 4 in the designed state. Also, the amount of protrusion is preferably a length that allows the light emitting layer 7B not to protrude outside the electron blocking layer 6B in plan view, or a length that allows the possibility of the protrusion to be practically ignored.

By adopting such a design, the light emitting layers 7 are prevented from overlapping each other between the pixels R, G, and B, or the possibility that the light emitting layers 7 overlap each other is extremely reduced. Here, for the pixel R, the same design as the pixel G and the pixel B may be adopted, and the planar shape of the electron blocking layer 6R may be larger than the light emitting layer 7R, and the area of the electron blocking layer 6R may be larger than the area of the light emitting layer 7R. However, as described above, since the electron blocking layer 6R and the light emitting layer 7R are formed before the electron blocking layer 6G and the light emitting layer 7G of the pixel G and the electron blocking layer 6B and the light emitting layer 7B of the pixel B, even if the area of the electron blocking layer 6R is increased, the electron blocking layer 6R does not overlap the light emitting layer 7G or the light emitting layer 7B, and unintentional light emission on the bank 4 is not suppressed. Accordingly, technical significance of making the planar shape of the electron blocking layer 6R larger than that of the light emitting layer 7R is low, and from the viewpoint of reducing manufacturing materials, it is preferable that the electron blocking layer 6R has the same shape as the light emitting layer 7R, that is, the areas of the electron blocking layer 6R and the light emitting layer 7R are equal.

The electroluminescence display device 200 according to this embodiment is expected to have further effects. This will be described below with reference to FIG. 5.

Figure 5:
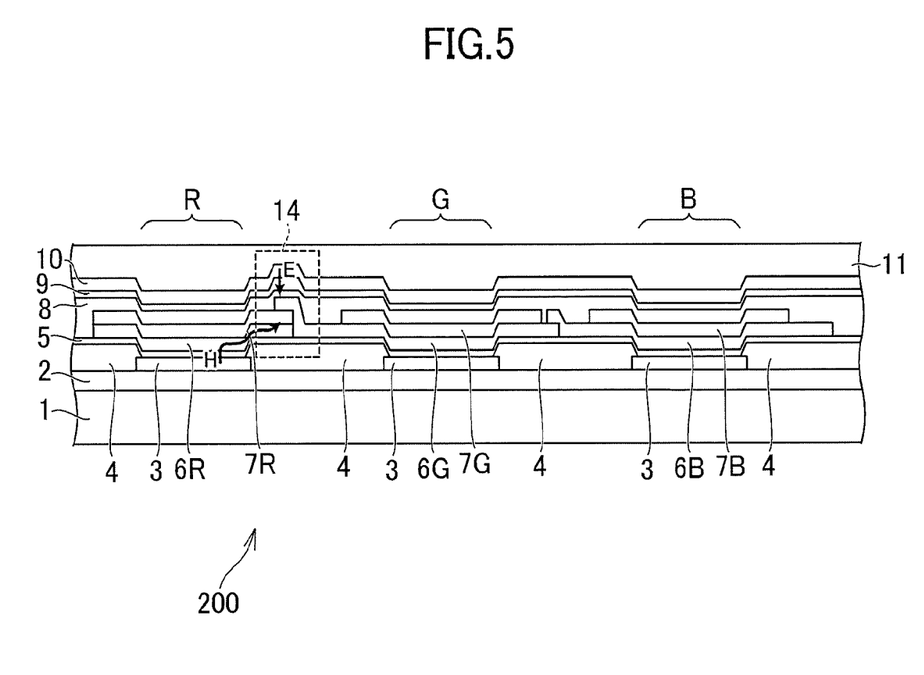
FIG. 5 is a schematic cross-sectional view illustrating the structure of the electroluminescence display device according to the second embodiment of the present invention when an electron blocking layer of the pixel G is formed by being shifted to the left side in the drawing.

FIG. 5 is a schematic cross-sectional view illustrating the structure of the electroluminescence display device 200 when the electron blocking layer 6G of the pixel G is formed by being shifted to the left side in the drawing. For the convenience of explanation, it is assumed that the other layers are not shifted and are formed at positions as designed.

In this case, if the order of formation of the respective layers described above is followed, as illustrated in FIG. 5, a part of the electron blocking layer 6G is overlapped on the electron blocking layer 6R and the light emitting layer 7R of the pixel R on the bank 4. Since this overlap does not reach the opening area of the pixel R, the overlap does not adversely affect the light emission of the pixel R itself.

On the other hand, when a positive voltage is applied to the pixel electrode 3 of the pixel R in order to light the pixel R, some of the generated holes move to an outer region of the pixel R through the electron blocking layer 6R. Here, the holes that move toward the right side of the pixel R in FIG. 5 are considered.

Theoretically, the holes move in the electron blocking layer 6R as indicated by the arrow H, and can enter the light emitting layer 7R outside the pixel R on the bank 4. However, in the case illustrated in FIG. 5, the electron blocking layer 6G of the pixel G is further formed on the light emitting layer 7R on the bank 4 indicated by a region 14 to overlap the light emitting layer 7R. For that reason, the electrons introduced from the common electrode 10 are blocked by the electron blocking layer 6G and cannot enter the light emitting layer 7R, as indicated by the arrow E in FIG. 5. Therefore, at least in a region overlapping the electron blocking layer 6G, holes and electrons are not combined in the light emitting layer 7R, and the light emission does not occur.

This means that if the electron blocking layer 6G is overlapped on the light emitting layer 7R of the adjacent pixel R on the bank 4, light emission of its own color on the bank 4 which is outside the range of the pixel R is reduced.

This effect of reducing light emission of its own color does not necessarily occur, and since the positional shift of each layer that occurs stochastically is caused when the disposition illustrated in FIG. 5 is obtained, such a structure occurs stochastically. That is, even when the positions in the horizontal direction of the layers constituting the electro luminescence display device 200 are formed by being shifted, unintentional light emission of its own color on the bank 4 is prevented with a certain probability, and as a whole, unintentional light emission of its own color on the bank 4 is reduced, which leads to an improvement in display characteristics.

Of course, also in the second embodiment illustrated in FIG. 4 and FIG. 5, as in the first embodiment described above, as a whole, color mixture due to unintentional light emission of the adjacent pixel color on the bank 4 is also reduced. An example in which color mixture due to unintentional light emission of the adjacent pixel color on the bank 4 is reduced in the second embodiment will be described with reference to FIG. 6.

Figure 6:
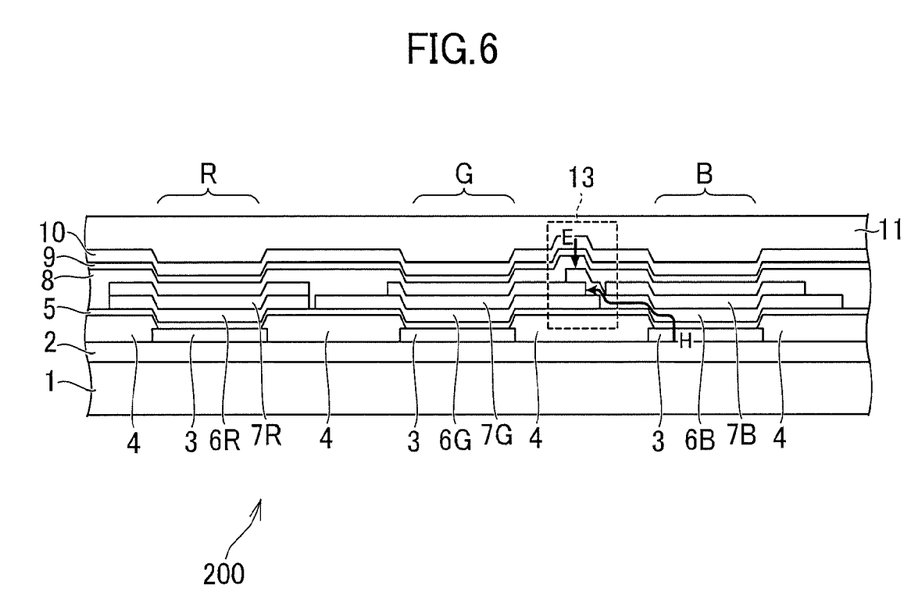
FIG. 6 is a diagram illustrating an example in which color mixture due to unintentional light emission of the adjacent pixel color on a bank is reduced in the second embodiment of the present invention.

FIG. 6 illustrates a case where the light emitting layer 7G of the pixel G is formed by being shifted to the right side in the drawing. For the convenience of explanation, it is assumed that the other layers are not shifted and are formed at positions as designed (that is, the same positions as illustrated in FIG. 4). In this case, the light emitting layer 7G overlaps the electron blocking layer 6B of the pixel B on the bank 4 in the region 13 of the cross-section of the electroluminescence display device 200. However, in the electroluminescence display device 200, since the electron blocking layer 6B of the pixel B is formed after the light emitting layer 7G of the pixel G is formed, as illustrated in FIG. 6, the electron blocking layer 6B is formed on the light emitting layer 7G extending to the pixel B side on the bank 4, and the light emitting layer 7G of the pixel G and the hole blocking layer 8 are not indirect contact with each other.

In this case, it is considered that some of the holes introduced from the pixel electrode 3 of the pixel B move in the electron blocking layer 6B to the outside of the pixel B, enter the region 13, and reach the light emitting layer 7G, as indicated by the arrow H. However, the electrons introduced from the common electrode 10 are blocked by the electron blocking layer 6B and cannot reach the light emitting layer 7G, as indicated by the arrow E. For that reason, the holes and the electrons are not combined in the light emitting layer 7G, and unintentional light emission on the bank 4 is prevented.

When the structure of the electroluminescence display device 200 illustrated in the second embodiment is expressed in a more general manner, it can be said that the area of the second blocking layer is larger than the area of the light emitting layer 7 in the pixel belonging to the array of pixels having at least one light emission color. Since the array of pixels having such a relationship is formed after the second blocking layer and the light emitting layer 7 for the array of pixels having another light emission color are formed, when light emission color of the array of pixels formed first is referred to as one light emission color, and light emission color of the array of pixels formed later is referred to as another light emission color, the area of the second blocking layer is larger than the area of the light emitting layer 7 in the pixel belonging to the array of pixels for other emission color. In this case, the area of the second blocking layer may be equal to the area of the light emitting layer 7 in the pixel belonging to the array of pixels for one emission color. As a result, on the bank 4, the second blocking layer belonging to another pixel that emits light of another light emission color is partially overlapped on the light emitting layer belonging to one pixel that emits light of one emission color, so that unintentional light emission of its own color on the bank 4 is reduced. Also, by design, the second blocking layer belonging to another pixel that emits light of another emission color is partially overlapped on the second blocking layer belonging to one pixel that emits light of one emission color (When description is made based on the example illustrated in FIG. 4, this indicates that, when "a pixel at a position that emits light in one emission color" is referred to as a pixel G and "another pixel that emits light in another emission color" is referred to as a pixel B, the electron blocking layer 6G and the electron blocking layer 6B overlap each other in the region 13).

Figure 7:
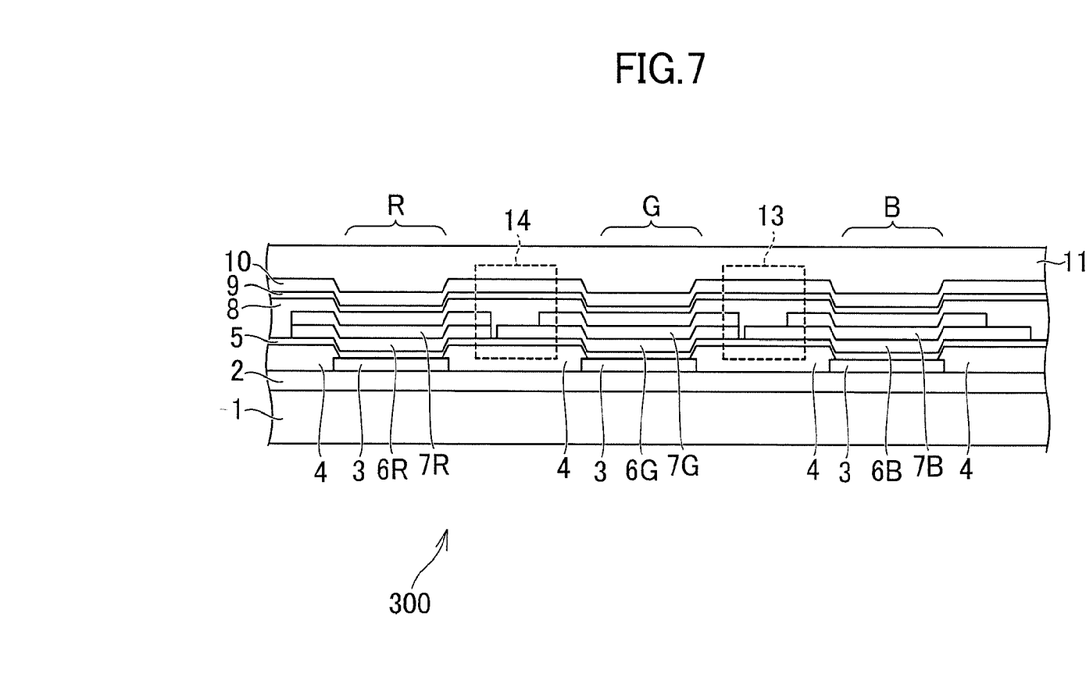
FIG. 7 is a schematic cross-sectional view illustrating a structure of an electroluminescence display device according to a third embodiment of the present invention.

FIG. 7 is a schematic cross-sectional view illustrating a structure of an electroluminescence display device 300 according to a third embodiment of the present invention. Also in this embodiment, the areas of the electron blocking layer 6G of the pixel G and the electron blocking layer 6B of the pixel B in plan view are larger than those of the light emitting layer 7G of the pixel G and the light emitting layer 7B of the pixel B, respectively, and the electron blocking layers 6G and 6B are formed to protrude around the light emitting layers 7G and 7B, and these matters are the same as the electroluminescence display device 200 according to the second embodiment. However, only the shape of the electron blocking layer 6G is different from that of the electroluminescence display device 200 according to the second embodiment.

As can be seen in the region 13 illustrated in FIG. 7, in a portion adjacent to the pixel B, the electron blocking layer 6G of the pixel G does not protrude from the light emitting layer 7G by design and has an asymmetric shape with respect to the center of the pixel G. On the other hand, as can be seen in the region 14, in a portion adjacent to the pixel R, the electron blocking layer 6G of the pixel G protrudes from the light emitting layer 7G, and is the same as that of the electroluminescence display device 200 according to the second embodiment (see FIG. 4).

As described above, since the electron blocking layer 6G of the pixel G is formed before the electron blocking layer 6B and the light emitting layer 7B of the pixel B, the electron blocking layer 6G is not formed to be overlapped on the electron blocking layer 6B or the light emitting layer 7B. Therefore, if the electron blocking layer 6G extends to protrude from the light emitting layer 7G to the pixel B side, the effect of preventing or reducing color mixture due to unintentional light emission of the adjacent pixel color on the bank 4, and unintentional light emission of its own color is not realized, and the technical significance is low. Accordingly, from the viewpoint of reducing materials used during manufacturing, the shape of the electron blocking layer 6G of the pixel G is preferably the same as that of the light emitting layer 7G in the region adjacent to the pixel B. As a result of adopting such a design, as illustrated in FIG. 6, the geometric center of the light emitting layer 7G of the pixel G coincides with the geometric center of the pixel G, while the geometric center of the electron blocking layer 6G is offset to the pixel R side.

Of course, similarly as in the electroluminescence display device 100 according to the first embodiment and the electroluminescence display device 200 according to the second embodiment, the electroluminescence display device 300 according to the third embodiment described here has an effect of stochastically reducing color mixture due to unintentional light emission of the adjacent pixel color, and unintentional light emission of its own color on the bank 4, and in addition, the amount of the material used for the electron blocking layer 6 is reduced. In the third embodiment, an example in which color mixture due to unintentional light emission of the adjacent pixel color on the bank 4, and unintentional light emission of its own color are reduced will be described with reference to FIG. 8.

Figure 8:
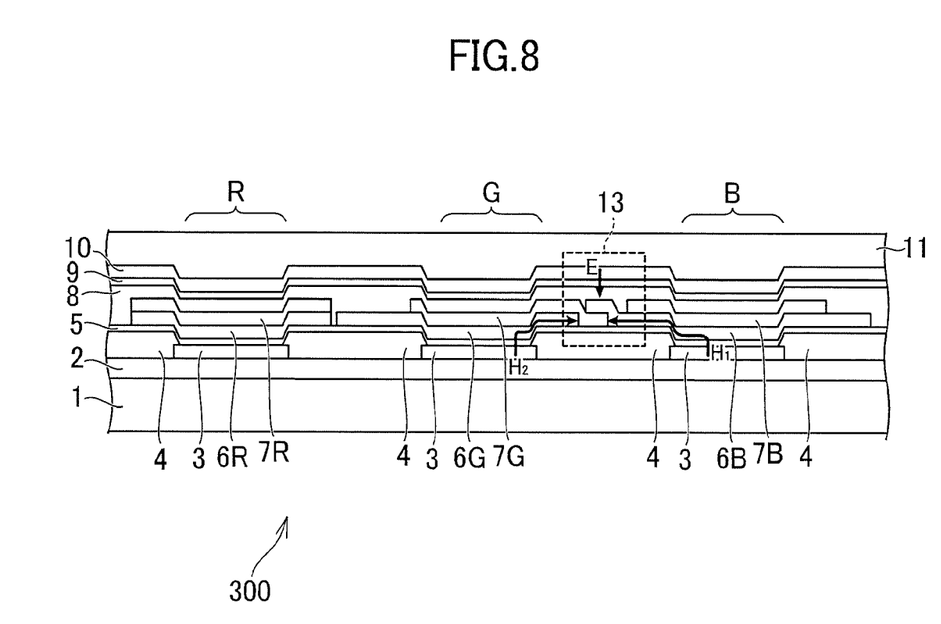
FIG. 8 is a diagram illustrating an example in which color mixture due to unintentional light emission of the adjacent pixel color and unintentional light emission of its own color on the bank are reduced in the third embodiment of the present invention.

FIG. 8 illustrates a case where the light emitting layer 7G of the pixel G is formed by being shifted to the right side in the drawing. For the convenience of explanation, it is assumed that the other layers are not shifted and are formed at positions as designed (that is, the same positions as illustrated in FIG. 7). In this case, the light emitting layer 7G overlaps the electron blocking layer 6B of the pixel B on the bank 4 in the region 13 of the cross-section of the electroluminescence display device 300. However, also in the electroluminescence display device 300, since the electron blocking layer 6B of the pixel B is formed after the light emitting layer 7G of the pixel G is formed, as illustrated in FIG. 6, the electron blocking layer 6B is formed on the light emitting layer 7G extending to the pixel B side on the bank 4, and the light emitting layer 7G and the hole blocking layer 8 of the pixel G are not in direct contact with each other.

In this case, it is considered that some of the holes introduced from the pixel electrode 3 of the pixel B can move in the electron blocking layer 6B to the outside of the pixel B, enter the region 13, and reach the light emitting layer 7G, as indicated by an arrow H1. However, the electrons introduced from the common electrode 10 are blocked by the electron blocking layer 6B and cannot reach the light emitting layer 7G, as indicated by the arrow E. Thus, holes and electrons are not combined in the light emitting layer 7G, and unintentional light emission of the adjacent pixel color (green in the example of this description) on the bank 4 is prevented.

Furthermore, it is considered that some of the holes introduced from the pixel electrode 3 of the pixel G can move in the electron blocking layer 6G to the pixel B side, enter the region 13, and can reach the portion of the light emitting layer 7G protruding from the electron blocking layer 6G on the bank 4, as indicated by an arrow H2. However, even in this case, the electrons introduced from the common electrode 10 are blocked by the electron blocking layer 6B and cannot reach the light emitting layer 7G, as indicated by the arrow E. Thus, holes and electrons are not combined in the light emitting layer 7G protruding from the electron blocking layer 6G on the bank 4, and unintentional light emission of its own color on the bank 4 is reduced.

The present invention is not limited to the embodiments described above, and various alterations may be made thereto. For example, the configuration of the present invention can be replaced with a configuration that is substantially the same as the configuration described in the embodiments described above, a configuration that exhibits the same operational effects, or a configuration that can achieve the same purpose.

In the scope of the technical idea of the present invention, those skilled in the art can conceive various changes and modifications, and it is understood that these changes and modifications also belong to the scope of the present invention. For example, for each of the embodiments described above, appropriate addition, deletion, or design changes of constitutional elements, or addition, omission, or changes in conditions of processes performed by those skilled in the art are also within the scope of the invention as long as they include the gist of the invention.

While there have been described what are at present considered to be certain embodiments of the invention, it will be understood that various modifications may be made thereto, and it is intended that the appended claims cover all such modifications as fall within the true spirit and scope of the invention.

What is claimed is:
1. An electroluminescence display device, comprising:
   a first pixel electrode;
   a second pixel electrode adjacent to the first pixel electrode;
   a bank layer covering each edges of the first pixel electrode and second pixel electrode, the bank layer having a first aperture exposing a part of upper surface of the first pixel electrode and a second aperture exposing a part of upper surface of the second pixel electrode;
   a first blocking layer covering the first aperture, the first blocking layer not covering the second aperture;
   a first light emitting layer on the first blocking layer, the first light emitting layer covering the first aperture;
   a second blocking layer covering the second aperture, the second blocking layer not covering the first aperture; and
   a second light emitting layer on the second blocking layer, the second light emitting layer covering the second aperture, wherein
   the first blocking layer and the second blocking layer are apart from each other,
   the first light emitting layer and the second light emitting layer are apart from each other, and
   the first light emitting layer and the second blocking layer are overlapped with each other at a region, which is above the bank layer and does not overlap with the first aperture and the second aperture.

2. The electroluminescence display device according to claim 1, wherein the first light emitting layer, the second blocking layer, and the second light emitting layer are overlapped with each other at the region.

3. The electroluminescence display device according to claim 1, wherein
an area of the first blocking layer is equal to an area of the first light emitting layer, and
an area of the second blocking layer is equal to an area of the second light emitting layer.

4. The electroluminescence display device according to claim 1, wherein
an area of the first blocking layer is larger than an area of the first light emitting layer, and
an area of the second blocking layer is larger than an area of the second light emitting layer.

* * * * *